United States Patent
Zhang et al.

(10) Patent No.: US 11,464,112 B2
(45) Date of Patent: Oct. 4, 2022

(54) TOUCH LED COMPONENT AND TOUCH DEVICE

(71) Applicants: Defond Electech Co., Ltd., Dongguan (CN); Defond Components Limited, Chaiwan (HK)

(72) Inventors: Lei Zhang, Dongguan (CN); Guo Zhu Zeng, Dongguan (CN); Jian Hua Gong, Dongguan (CN); Ding Wei Que, Dongguan (CN); Yun Zhang, Dongguan (CN)

(73) Assignees: Defond Electech Co., Ltd., Dongguan (CN); Defond Components Limited, Hong Kong (CN)

( * ) Notice: Subject to any disclaimer, the term of this patent is extended or adjusted under 35 U.S.C. 154(b) by 404 days.

(21) Appl. No.: 16/721,903

(22) Filed: Dec. 19, 2019

(65) Prior Publication Data

US 2021/0037650 A1    Feb. 4, 2021

(30) Foreign Application Priority Data

Jul. 30, 2019 (CN) .......................... 201921214895.3

(51) Int. Cl.
| | |
|---|---|
| *H05K 1/11* | (2006.01) |
| *H05K 1/18* | (2006.01) |
| *H01L 33/48* | (2010.01) |
| *H01L 33/62* | (2010.01) |

(52) U.S. Cl.
CPC ............. *H05K 1/18* (2013.01); *H01L 33/483* (2013.01); *H01L 33/62* (2013.01); *H05K 2201/1003* (2013.01); *H05K 2201/10106* (2013.01); *H05K 2201/10113* (2013.01); *H05K 2201/10265* (2013.01); *H05K 2201/10515* (2013.01); *H05K 2201/10537* (2013.01)

(58) Field of Classification Search
CPC .......... H05K 2201/10106; H05K 2201/10113; H05K 1/118; F21K 9/235; F21K 9/237
See application file for complete search history.

(56) References Cited

FOREIGN PATENT DOCUMENTS

DE    202019105572 U1 *  11/2019  ............... F21K 9/00

OTHER PUBLICATIONS

Machine translation of DE 202019105572 U1, Defend et al, 2019 (Year: 2019).*

* cited by examiner

*Primary Examiner* — Jeremy C Norris
(74) *Attorney, Agent, or Firm* — Nitin Kaushik

(57) ABSTRACT

A touch LED component and a touch device, and the touch LED component includes a metal cap, a touch button sheathed on an inner wall of the metal cap, and an LED lamp bead coupled to an inner wall of the touch button, a first through hole formed at the top of the metal cap, an induction pin installed at the bottom of the touch button, and an anode pin and a cathode pin installed on both sides of the bottom of the LED lamp bead respectively. The touch device includes a touch panel, a circuit board, and plural touch LED components. The touch LED component with high integration can be packaged by carrier tapes to facilitate automatic plug-ins and simplify production and assembling processes for mass production. The touch device has the features of simple structure, high reliability, good effect and long life.

10 Claims, 3 Drawing Sheets

TOUCH LED COMPONENT AND TOUCH DEVICE

FIELD OF INVENTION

The present invention relates to the field of electronic components, in particular to a touch LED component and a touch device.

BACKGROUND OF INVENTION

Description of the Related Art

In general, a conventional capacitive touch button includes a cover plate, and a spring installed onto the cover plate, and an induction signal of a user's finger is transmitted through the spring to a printed circuit board (PCB), and an LED lamp serving as a button indication is installed in the middle of the LED lamp, wherein the touch induction spring and the LED lamp are two independent components. Since the spring cannot be produced by using an automatic plug-in machine, but it can only be produced by a manual plug-in method, therefore the productivity is very low, and the spring is easily affected by vibration to cause a shift of position and affect the touch performance. As a result, the reliability of the capacitive touch button is lowered significantly, and the quality of the product is affected adversely.

SUMMARY OF THE INVENTION

In view of the aforementioned drawbacks of the prior art, it is a primary objective of the present invention to provide a touch LED component with high integration which can be packaged by carrier tapes to facilitate the automatic plug-in of the components and simplify the production and assembly for mass production.

Another objective of the present invention is to provide a carrier-tape packaging structure of the touch LED component, so as to achieve the effects of facilitating an automatic plug-in process of the touch LED component and simplifying the production and assembling processes for mass production.

A further objective of the present invention is to provide a touch device with the features of simple structure, high reliability, good effect and long life.

To achieve the aforementioned and other objectives, the present invention provides a touch LED component, comprising: a metal cap; a touch button sheathed on and coupled to an inner wall of the metal cap; an LED lamp bead coupled to an inner wall of the touch button; a first through hole formed at the top of the metal cap; an induction pin installed at the bottom of the touch button; and an anode pin and cathode pin installed on both sides of the bottom of the LED lamp bead respectively.

Further, the LED lamp bead comprises a lamp bead holder, a second through hole formed on the lamp bead holder and provided for passing the induction pin, and the bottoms of the induction pin, the anode pin and the cathode pin penetrate through the lamp bead holder.

Further, the induction pin, the anode pin, and the cathode pin are arranged side by side.

Further, the induction pin has a circular cross-section, and both of the anode pin and the cathode pin have a square cross-section.

Further, the touch button is a spring.

Further, the touch button has a height greater than the height of the metal cap and the height of the LED lamp bead.

A carrier-tape packaging structure of a touch LED component adopts a S-PIN carrier tape to sequentially package the plurality of touch LED components A touch device comprises: a touch panel, a circuit board, and the plurality of touch LED components, wherein the touch LED component is installed between the touch panel and the circuit board, and a metal cap of the touch LED component abuts against the touch panel, and an induction pin, an anode pin, and a cathode pin of the touch LED component are soldered onto the circuit board.

Further, each touch LED component has an LED lamp bead which can be turned on, off, and blinked independently.

Further, wherein each touch LED component has an LED lamp bead of a different color The present invention has the following advantageous effects:

The touch LED component with high integration can be packaged by carrier tapes to facilitate automatic plug-ins and simplify production and assembling processes for mass production.

The carrier-tape packaging structure facilitates the automatic plug-ins of the touch LED components and simplifies the production and assembly for mass production.

The touch device has the features of simple structure, high reliability, good effect and long life.

BRIEF DESCRIPTION OF NUMERALS USED IN THE FIGURES

1: Metal cap; 11: First through hole; 2: Touch button; 21: Induction pin; 3: LED lamp bead; 31: Anode pin; 32: Cathode pin; 33: Lamp bead holder; 4: Touch LED component; 41: 3-PIN carrier tape.

DESCRIPTION OF THE PREFERRED EMBODIMENTS

To make it easier for our examiner to understand the objective of the invention, its structure, innovative features, and performance, we use a preferred embodiment together with the attached drawings (FIGS. 1 to 3) for the detailed description of the invention. The contents provided in the embodiment is provided for the purpose of illustrating the present invention, but not intended for limiting the scope of the invention.

Figure 1:
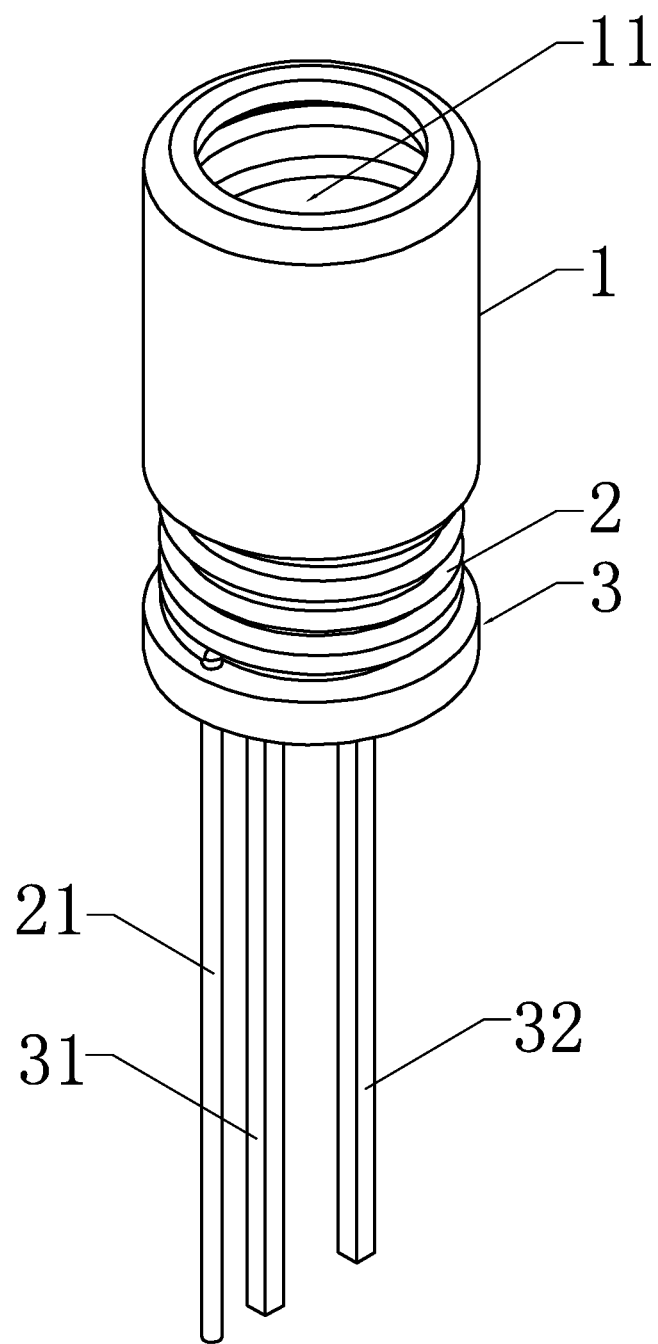
FIG. 1 is a perspective view of a touch LED component of the present invention.
Figure 2:
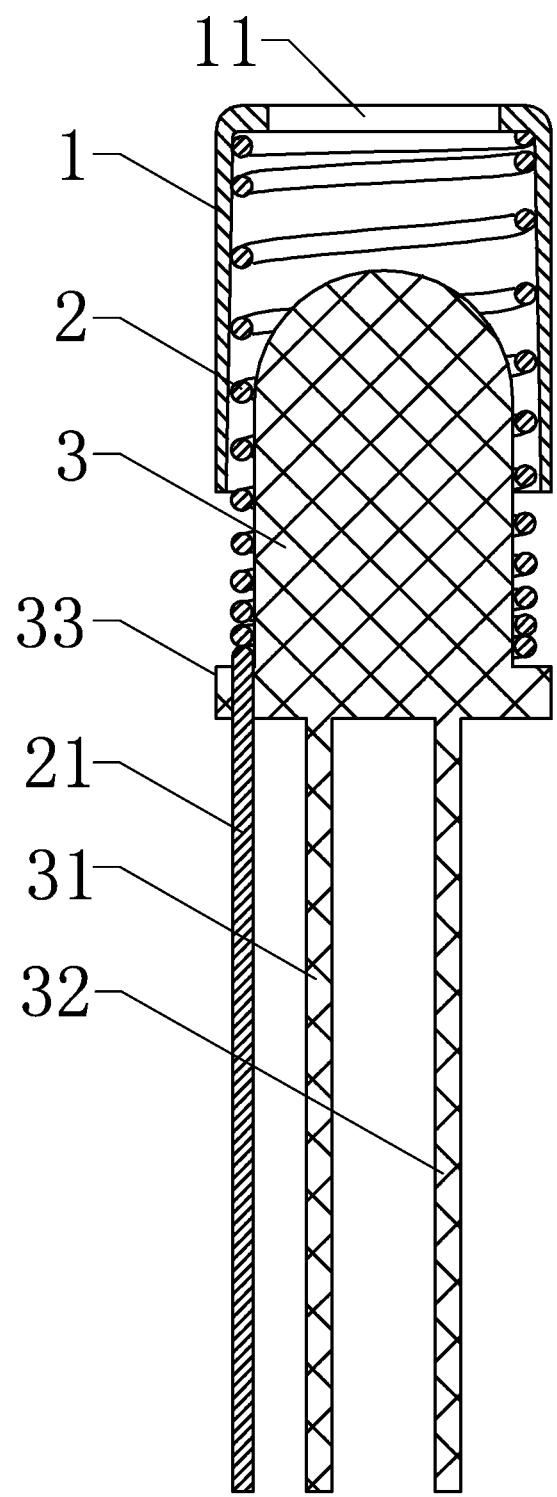
FIG. 2 is a cross-sectional view of a touch LED component of the present invention.

With reference to FIGS. 1 and 2, the touch LED component 4 comprises a metal cap 1, a touch button 2 sheathed on and coupled to an inner wall of the metal cap 1, and an LED lamp bead 3 coupled to an inner wall of the touch button 2, a first through hole 11 formed at the top of the metal cap 1, an induction pin 21 installed at the bottom of the touch button 2, and an anode pin 31 and a cathode pin 32 installed on both sides of the bottom of the LED lamp bead 3 respectively.

The touch LED component 4 is packaged with the LED lamp bead 3, the touch button 2, and the metal cap 1 into a piece by plug-in or patch, and the touch LED component 4 has the functions of LED indication, touch induction, and button stroke. With the first through hole 11 formed at the top of the metal cap 1, the light emitted from the LED lamp bead 3 can be passed through the first through hole 11 at the top of the metal cap 1 directly and projected perpendicularly, so that the characters displayed on the touch panel have a light transmission effect which makes the light transmission of an electronic device more personalized, beautiful, and practical.

The touch LED component 4 of the present invention with high integration can be packaged by carrier tapes to achieve the effects of facilitating automatic plug-ins and simplifying the production and assembling processes for mass production.

The metal cap 1 is a circular metal cap, and the first through hole 11 is a circular through hole. The size of the touch induction area can be changed by adjusting the diameter of the metal cap 1, and the circular metal cap provides a convenient use and facilitates production, and the circular through hole gives a light transmission effect with uniform distribution.

In this embodiment, the LED lamp bead 3 comprises a lamp bead holder 33, a second through hole formed on the lamp bead holder 33 and provided for passing the induction pin 21, and the bottoms of the induction pin 21, the anode pin 31, and the cathode pin 32 penetrate through the lamp bead holder 33, and the induction pin 21, the anode pin 31 and the cathode pin 32 are soldered onto the circuit board to constitute the touch device that can be applied to different electrical appliances.

In this embodiment, the induction pin 21, the anode pin 31, and the cathode pin 32 are arranged side by side, and such arrangement facilitate a carrier-tape packaging and an external plug-in process and simplifies the production and assembling processes.

In this embodiment, the induction pin 21 has a circular cross-section, and both of the anode pin 31 and the cathode pin 32 has a square cross-section, so as to facilitate positioning and soldering these pins 21, 31, 32 onto the circuit board.

In this embodiment, the touch button 2 is a spring. Specifically, the touch button 2 is a spiral spring made by winding a metal wire. Preferably, the touch button 2 is a cylindrical spiral spring, and such arrangement provides a convenient of use and a simple structure.

In this embodiment, the touch button 2 has a height greater than the height of the metal cap 1 and the height of the LED lamp bead 3. The specific size of the touch button 2 including the peripheral diameter and height can be custom made according to different model numbers. In this embodiment, the height of the metal cap 1 is approximately equal to ⅔ of the height of the touch button 2, and the height of the metal cap 1 is approximately equal to the height of the LED lamp bead 3, and the top of the touch button 2 abuts against the inner wall of the top of the metal cap 1, and the bottom of the touch button 2 abuts against the top of the lamp bead holder 33, and such arrangement provides a light transmission effect with an uniform distribution.

Figure 3:
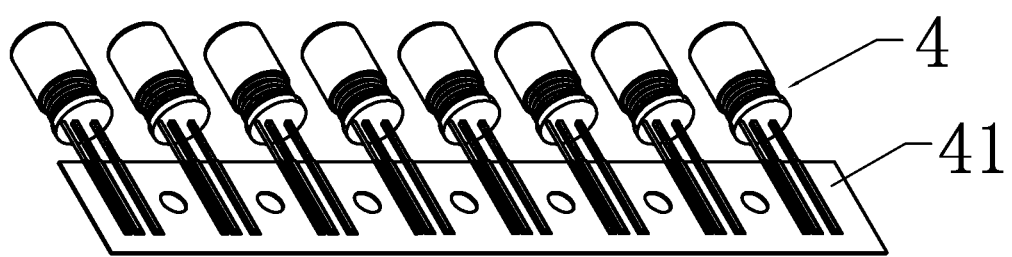
FIG. 3 is a perspective view of a carrier-tape packaging structure of the present invention.

In FIG. 3, a carrier-tape packaging structure of the touch LED component 4 adopts a 3-PIN carrier tape to package the plurality of touch LED components 4 sequentially.

The carrier-tape packaging structure of the present invention adopts a 3-PIN carrier tape packaging method to achieve the effects of facilitating the automatic plug-in process of the touch LED components 4 and simplifying the production and assembling processes for mass production.

The touch device comprises a touch panel, a circuit board, and the plurality of touch LED components 4, wherein the touch LED component 4 is installed between the touch panel and the circuit board, and the metal cap 1 of the touch LED component 4 abuts against the touch panel, and the induction pin 21, the anode pin 31, and the cathode pin 32 of the touch LED component 4 are soldered onto the circuit board.

A touch device of the present invention has the features of simple structure, high reliability, good effect, and long life.

In this embodiment, the LED lamp bead 3 of each touch LED component 4 can be turned on/off or blinked independently. In the LED lamp bead 3 of each touch LED component 4, the on, off, or blinking status of the touch button 2 can be controlled by a different I/O of a MCU to remind the users and reduce the occurrence of mispressing the button.

In this embodiment, the LED lamp bead 3 of each touch LED component 4 comes with a different color, and such arrangement allows the touch button 2 to show a different color in order to remind the users and reduce the occurrence of mispressing the button.

While the invention has been described by means of specific embodiments, numerous modifications and variations could be made thereto by those skilled in the art without departing from the scope and spirit of the invention set forth in the claims.

What is claimed is:

1. A touch LED component, comprising: a metal cap; a touch button sheathed on and coupled to an inner wall of the metal cap; an LED lamp bead coupled to an inner wall of the touch button; a first through hole formed at the top of the metal cap; an induction pin installed at the bottom of the touch button; and an anode pin and cathode pin installed on both sides of the bottom of the LED lamp bead respectively.

2. The touch LED component as claimed in claim 1, wherein the LED lamp bead comprises a lamp bead holder, a second through hole formed on the lamp bead holder and provided for passing the induction pin, and the bottoms of the induction pin, the anode pin and the cathode pin penetrate through the lamp bead holder.

3. The touch LED component as claimed in claim 1, wherein the induction pin, the anode pin, and the cathode pin are arranged side by side.

4. The touch LED component as claimed in claim 1, wherein the induction pin has a circular cross-section, and both of the anode pin and the cathode pin have a square cross-section.

5. The touch LED component as claimed in claim 1, wherein the touch button is a spring.

6. The touch LED component as claimed in claim 1, wherein the touch button has a height greater than the height of the metal cap and the height of the LED lamp bead.

7. A carrier-tape packaging structure of a touch LED component, characterized in that a 3-PIN carrier tape is provided for sequentially packaging a plurality of touch LED components as claimed in claim 1.

8. A touch device, comprising: a touch panel, a circuit board, and a plurality of touch LED components as claimed in claim 1, wherein the touch LED component is installed between the touch panel and the circuit board, and a metal cap of the touch LED component abuts against the touch panel, and an induction pin, an anode pin, and a cathode pin of the touch LED component are soldered onto the circuit board.

9. The touch device as claimed in claim 8, wherein each touch LED component has an LED lamp bead which can be turned on, off, and blinked independently.

10. The touch device as claimed in claim 8, wherein each touch LED component has an LED lamp bead of a different color.

\* \* \* \* \*